United States Patent
Hsieh et al.

(10) Patent No.: US 11,867,989 B2
(45) Date of Patent: Jan. 9, 2024

(54) DISPLAY DEVICE

(71) Applicant: InnoLux Corporation, Miao-Li County (TW)

(72) Inventors: Hong-Sheng Hsieh, Miao-Li County (TW); Hao-Yu Chen, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 17/568,936

(22) Filed: Jan. 5, 2022

(65) Prior Publication Data

US 2022/0244585 A1    Aug. 4, 2022

(30) Foreign Application Priority Data

Feb. 3, 2021 (CN) .......................... 202110148297.6

(51) Int. Cl.
*G02F 1/13* (2006.01)
*G09G 3/34* (2006.01)
*H10K 59/50* (2023.01)

(52) U.S. Cl.
CPC ......... *G02F 1/1323* (2013.01); *G09G 3/3406* (2013.01); *H10K 59/50* (2023.02); *G09G 2358/00* (2013.01)

(58) Field of Classification Search
CPC .......................... G02F 1/1323; G09G 3/3406; G09G 2358/00; H01L 27/3232
See application file for complete search history.

(56) References Cited

U.S. PATENT DOCUMENTS

| | | | | |
|---|---|---|---|---|
| 5,638,200 A * | 6/1997 | Xu | ...................... | G02F 1/133632 359/489.07 |
| 6,359,671 B1 * | 3/2002 | Abileah | ............ | G02F 1/133632 349/119 |
| 8,680,567 B2 | 3/2014 | Tischler et al. | | |
| 2008/0117365 A1 * | 5/2008 | Maeda | .............. | G02F 1/133528 349/96 |
| 2012/0268673 A1 * | 10/2012 | Sakamoto | .............. | G02B 30/27 349/15 |
| 2017/0059899 A1 * | 3/2017 | Su | .......................... | G02F 1/1323 |
| 2018/0284341 A1 | 10/2018 | Woodgate et al. | | |
| 2021/0375222 A1 * | 12/2021 | Koito | ........................ | G02F 1/13 |

OTHER PUBLICATIONS

English Translation of Korean Patent Publication 20020057023 (Year: 2002).*
English Translation of Chinese Patent Publication 111767901 (Year: 2020).*

* cited by examiner

*Primary Examiner* — Patrick N Edouard
*Assistant Examiner* — Eboni N Giles
(74) *Attorney, Agent, or Firm* — McClure, Qualey & Rodack, LLP (57) ABSTRACT

A display device is provided. The display device includes a display panel including a substrate and a plurality of scan lines disposed on the substrate and extending in a first direction, a backlight module disposed under the display panel, and an optical film disposed above the backlight module and including a plurality of light-blocking portions and a plurality of light-transmission portions which are arranged alternately. The light blocking portions extend in a second direction, and the first direction and the second direction are not parallel.

18 Claims, 8 Drawing Sheets

DISPLAY DEVICE

CROSS REFERENCE TO RELATED APPLICATIONS

This application claims priority of China Patent Application No. 202110148297.6, filed on Feb. 3, 2021, the entirety of which are incorporated by reference herein.

BACKGROUND

Technical Field

The present disclosure relates to a display device, and in particular to a display device configured with a rotatable optical film.

Description of the Related Art

At present, for an automotive display used in the front passenger seat, in order to prevent a passenger from interfering with the driver while watching audio-visual entertainment content, the display in front of the passenger must have a privacy function that can be turned on and off. One way to do this is to place additional privacy devices on the display.

In addition, due to driving safety considerations, the demand for display quality or optical design of automotive displays continues to increase.

SUMMARY

In accordance with one embodiment of the present disclosure, a display device is provided. The display device includes a display panel including a substrate and a plurality of scan lines disposed on the substrate and extending in a first direction, a backlight module disposed under the display panel, and an optical film disposed above the backlight module and including a plurality of light-blocking portions and a plurality of light-transmission portions which are arranged alternately. The light-blocking portions extend in a second direction, and the first direction and the second direction are not parallel.

A detailed description is given in the following embodiments with reference to the accompanying drawings.

BRIEF DESCRIPTION OF THE DRAWINGS

The disclosure may be understood by reading the subsequent detailed description and examples with references made to the accompanying drawings, wherein.

DETAILED DESCRIPTION

Various embodiments or examples are provided in the following description to implement different features of the present disclosure. The elements and arrangement described in the following specific examples are merely provided for introducing the present disclosure and serve as examples without limiting the scope of the present disclosure. For example, when a first component is referred to as "on a second component", it may directly contact the second component, or there may be other components in between, and the first component and the second component do not come in direct contact with one another.

It should be understood that additional operations may be provided before, during, and/or after the described method. In accordance with some embodiments, some of the stages (or steps) described below may be replaced or omitted.

In this specification, spatial terms may be used, such as "below", "lower", "above", "higher" and similar terms, for briefly describing the relationship between an element relative to another element in the figures. Besides the directions illustrated in the figures, the devices may be used or operated in different directions. When the device is turned to different directions (such as rotated 45 degrees or other directions), the spatially related adjectives used in it will also be interpreted according to the turned position. In addition, in this specification, expressions such as "first material layer disposed above/on/over a second material layer", may indicate the direct contact of the first material layer and the second material layer, or it may indicate a non-contact state with one or more intermediate layers between the first material layer and the second material layer. In the above situation, the first material layer may not be in direct contact with the second material layer. In some embodiments of the present disclosure, terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Herein, the terms "about", "around" and "substantially" typically mean a value is in a range of +/−15% of a stated value, typically a range of +/−10% of the stated value, typically a range of +/−5% of the stated value, typically a range of +/−3% of the stated value, typically a range of +/−2% of the stated value, typically a range of +/−1% of the stated value, or typically a range of +/−0.5% of the stated value. The stated value of the present disclosure is an approximate value. Namely, the meaning of "about", "around" and "substantially" still exists even if there is no specific description of "about", "around" and "substantially".

It should be understood that, although the terms "first", "second", "third", etc. may be used herein to describe various elements, components, regions, layers, portions and/or sections, these elements, components, regions, layers, portions and/or sections should not be limited by these terms. These terms are only used to distinguish one element, component, region, layer, portion or section from another element, component, region, layer, portion or section. Thus, a first element, component, region, layer, portion or section discussed below could be termed a second element, component, region, layer, portion or section without departing from the teachings of the present disclosure.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

Figure 1:
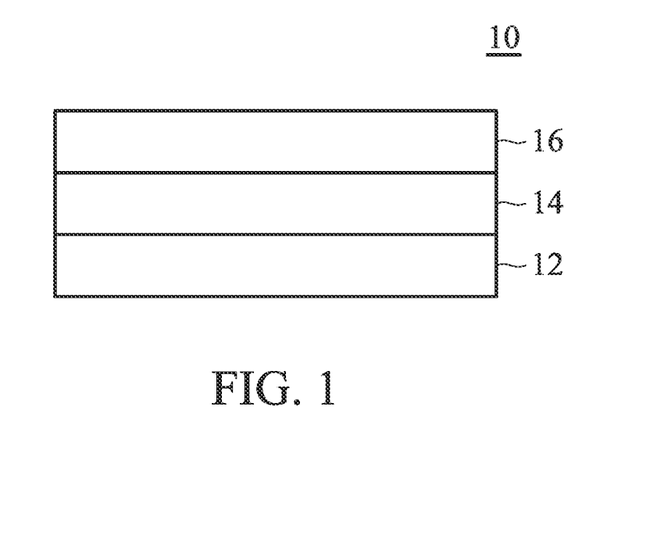
FIG. 1 illustrates a cross-sectional view of a display device in accordance with one embodiment of the present disclosure.

Referring to FIG. 1, in accordance with one embodiment of the present disclosure, a display device 10 is provided. FIG. 1 illustrates a cross-sectional view of the display device 10.

In FIG. 1, the display device 10 includes a backlight module 12, a privacy structure 14 and a display panel 16. The privacy structure 14 is disposed on the backlight module 12. The display panel 16 is disposed on the privacy structure 14. In some embodiments, the display device 10 may be a self-luminous diode display. The display device 10 includes the privacy structure 14 and the display panel 16. The display panel 16 may include organic light-emitting diodes (OLEDs), inorganic light-emitting diodes, mini LEDs, micro LEDs or quantum dot light-emitting diodes (QLEDs/QDLEDs).

In some embodiments, the backlight module 12 may include a light source module, a reflective sheet, a light-guide plate, an optical film set and a back plate, but the present disclosure is not limited thereto. In some embodiments, the light source module may include light-emitting diodes (LEDs), but the present disclosure is not limited thereto. The light-emitting diode may include organic light-emitting diodes (OLEDs), inorganic light-emitting diodes, mini LEDs, micro LEDs or quantum dot light-emitting diodes (QLEDs/QDLEDs), but the present disclosure is not limited thereto. In some embodiments, the optical film set may include a lower diffuser, an upper diffuser, a lower brightness enhancement film, an upper brightness enhancement film or a prism sheet, but the present disclosure is not limited thereto. In the backlight module 12, the arrangement of each component is as follows, but the present disclosure is not limited thereto. For example, the reflective sheet is disposed on one side of the back plate. The light-guide plate is disposed on the reflective sheet. The optical film set is disposed on the light-guide plate. The light source module is disposed on the other side of the back plate, opposite to the reflective sheet, the light-guide plate and the optical film set.

In some embodiments, the privacy structure 14 may include a lower substrate, a liquid crystal layer and an upper substrate, but the present disclosure is not limited thereto. In the privacy structure 14, the arrangement of each component is as follows, but the present disclosure is not limited thereto. For example, the upper and lower substrates are disposed oppositely, and the liquid crystal layer is disposed between the upper and lower substrates. In some embodiments, the upper and lower substrates may include glass or polymer, and electrodes are disposed on them to control the arrangement of liquid crystals in the liquid crystal layer to reach the open or closed state of the privacy structure 14, so as to effectively limit the light of a certain viewing angle without disturbing the driver.

In some embodiments, the display panel 16 may include a lower polarizer, a thin-film transistor layer, a color filter layer, an upper polarizer and a glass cover, but the present disclosure is not limited thereto. In the display panel 16, the arrangement of each component is as follows, but the present disclosure is not limited thereto. For example, the thin-film transistor layer is disposed on the lower polarizer. The color filter layer is disposed on the thin-film transistor layer. The upper polarizer is disposed on the color filter layer. The glass cover is disposed on the upper polarizer.

Figure 3:
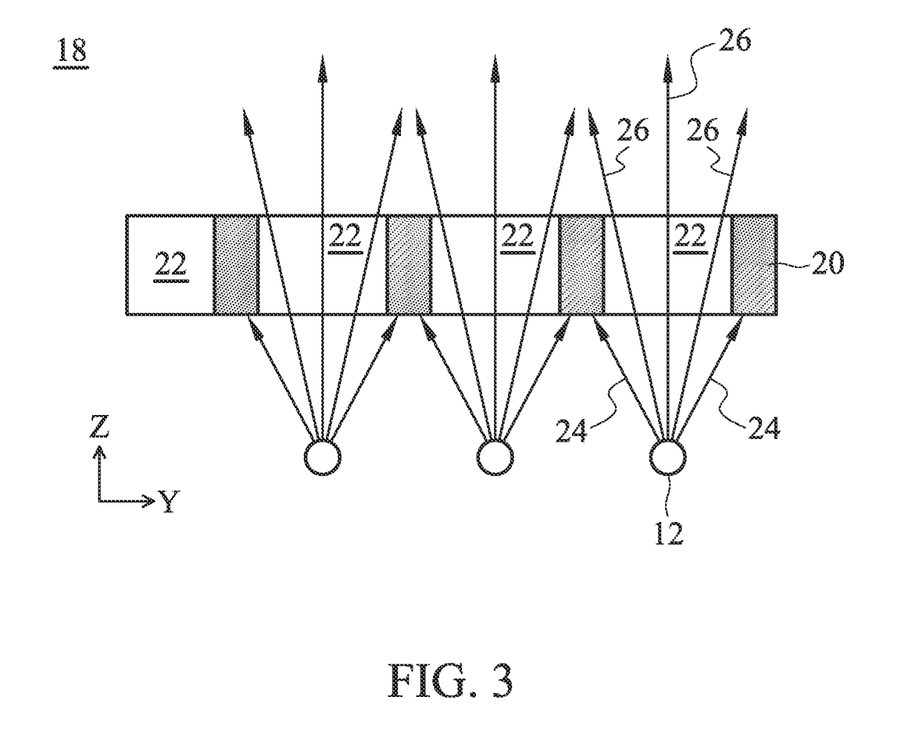
FIG. 3 illustrates a cross-sectional view of an optical film of a display device in accordance with one embodiment of the present disclosure.

In the embodiment shown in FIG. 1, the display device 10 further includes an optical film (not shown), which is disposed between the backlight module 12 and the privacy structure 14, but the present disclosure is not limited thereto. In some embodiments, the optical film is disposed between the privacy structure 14 and the display panel 16. In some embodiments, the optical film is disposed on the display panel 16. Referring to FIG. 3, the detailed structure of the optical film is illustrated. In some embodiments, the display device 10 may be a self-luminous diode display. The optical film is disposed on the display panel 16. In some embodiments, the display device 10 may be applied to an automotive display.

Figure 2:
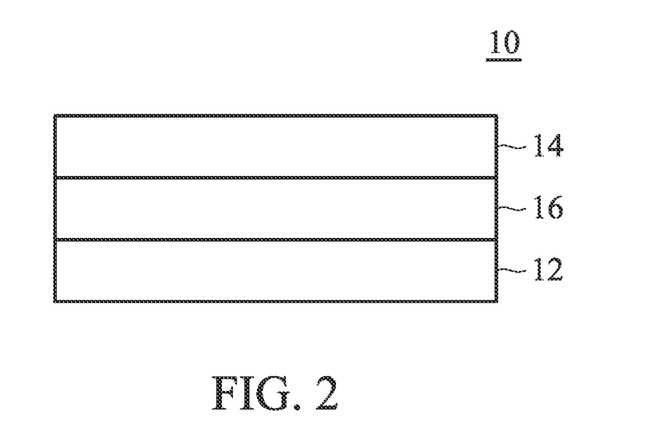
FIG. 2 illustrates a cross-sectional view of a display device in accordance with one embodiment of the present disclosure.

Referring to FIG. 2, in accordance with one embodiment of the present disclosure, a display device 10 is provided. FIG. 2 illustrates a cross-sectional view of the display device 10.

The structure of each component in the display device 10 shown in FIG. 2 is similar to that of the display device 10 shown in FIG. 1, and will not be repeated here. The main difference from FIG. 1 is the placement of some components. In FIG. 2, the display panel 16 is disposed on the backlight module 12. The privacy structure 14 is disposed on the display panel 16. In the embodiment shown in FIG. 2, the display device 10 further includes an optical film (not shown), which is disposed between the backlight module 12 and the display panel 16, but the present disclosure is not limited thereto. In some embodiments, the optical film is disposed between the display panel 16 and the privacy structure 14. In some embodiments, the optical film is disposed on the privacy structure 14. In some embodiments, the display device 10 may be a self-luminous diode display. The privacy structure 14 is disposed on the display panel 16. The optical film is disposed between the display panel 16 and the privacy structure 14. In some embodiments, the optical film is disposed on the privacy structure 14. Referring to FIG. 3, the detailed structure of the optical film is illustrated.

Referring to FIG. 3, in accordance with one embodiment of the present disclosure, an optical film 18 of a display device is provided. FIG. 3 illustrates a cross-sectional view of the optical film 18.

In FIG. 3, the optical film 18 includes a plurality of light-blocking portions 20 and a plurality of light-transmission portions 22, which are alternately arranged with each other, that is, the light-blocking portions 20 are arranged periodically. In some embodiments, the light-blocking portions 20 may include any suitable light-blocking material. In some embodiments, the light-transmission portions 22 may include any suitable transparent material. The optical film 18 is used to block a part of the light emitted by the backlight module 12. For example, the light 24 incident on the light-blocking portions 20 will be blocked by the light-blocking portions 20, and the light 26 that is not incident on the light-blocking portions 20 will not be affected. This forms an asymmetrical light pattern between the left and right viewing angles and the upper and lower viewing angles.

Figure 4:
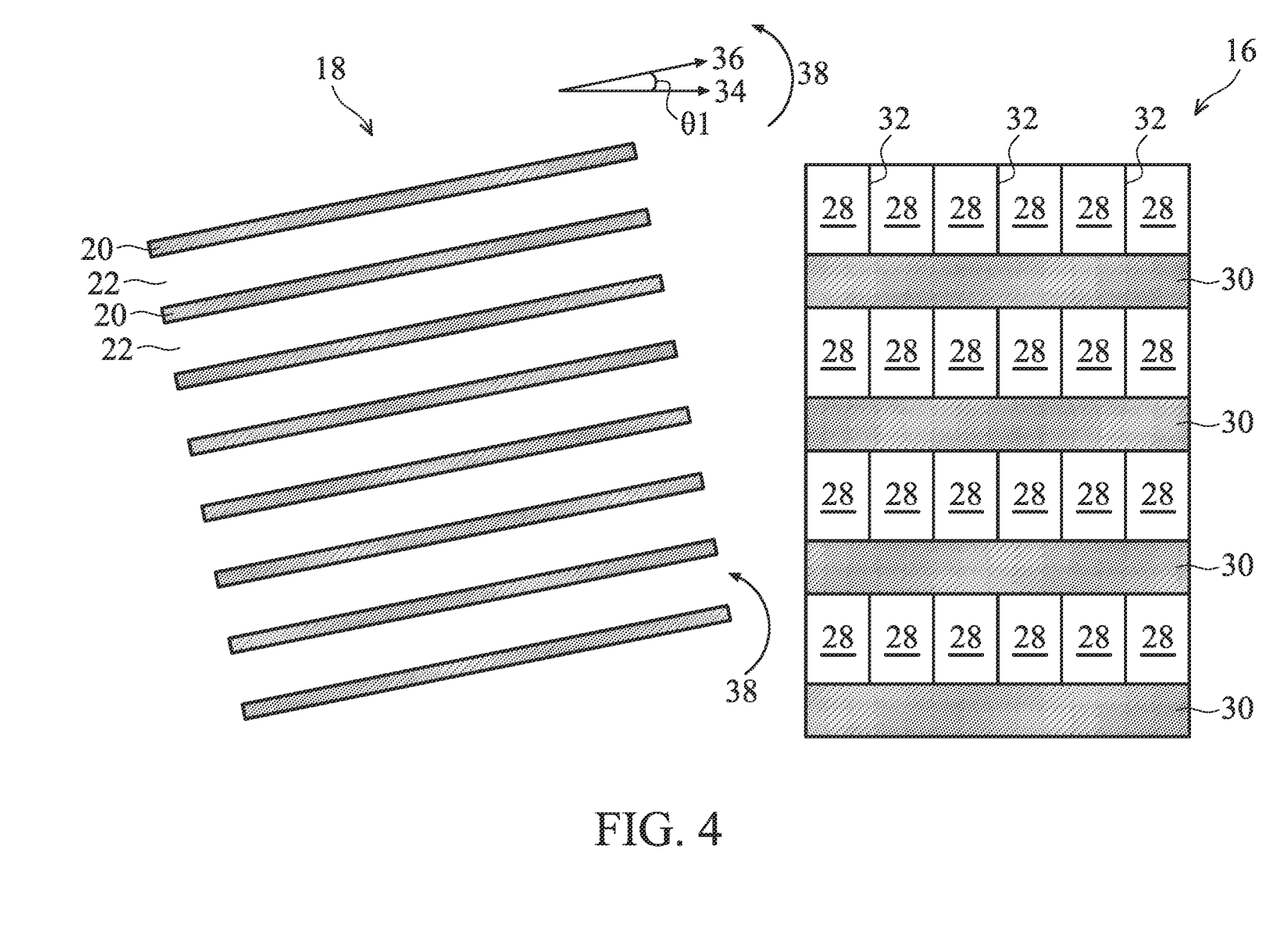
FIG. 4 illustrates a top view of a configuration relationship between a display panel and an optical film in accordance with one embodiment of the present disclosure.

Referring to FIG. 4, in accordance with one embodiment of the present disclosure, the configuration between the display panel 16 and the optical film 18 is provided. FIG. 4 illustrates a top view of the configuration between the display panel 16 and the optical film 18.

In FIG. 4, the optical film 18 is disposed under the display panel 16. For the convenience of description, some components of the display panel 16 are disclosed, for example, a plurality of color filters 28, a plurality of scan lines 30 and a plurality of data lines 32. The color filters 28 are disposed on a substrate (not shown). The scan lines 30 and the data lines 32 are periodically disposed on the substrate and located around the color filters 28. The viewer watches this display panel, and defines the horizontal viewing angles as 0 degrees and 180 degrees, and the vertical viewing angles as 90 degrees and 270 degrees. The scan lines 30 extend in a first direction 34. The angle between the first direction 34 and the zero-degree viewing angle ranges from 90 degrees to −90 degrees. The optical film 18 includes the plurality of light-blocking portions 20 and the plurality of light-transmission portions 22, which are alternately arranged with each other. The light-blocking portions 20 extend in a second direction 36. The angle between the second direction 36 and the zero-degree viewing angle ranges from 90 degrees to −90 degrees. Specifically, the first direction 34 and the second direction 36 are not parallel. As shown in FIG. 4, a first angle θ1 is formed between the second direction 36 in which the light-blocking portions 20 of the optical film 18 extend and the first direction 34 in which the scan lines 30 extend, in a counterclockwise direction 38 relative to the first direction 34 (that is, the angle that the optical film 18 is rotated by the first angle θ1 in a counter-clockwise direction 38). In some embodiments, the first angle θ1 is greater than 0 degrees and less than or equal to 20 degrees. In some embodiments, the first angle θ1 is greater than or equal to 4 degrees and less than or equal to 15 degrees. Since the display panel 16 and the underneath optical film 18 both contain periodic patterns, moiré interference is likely to occur when the two are superimposed. At this time, if the optical film 18 is appropriately rotated as shown in FIG. 4 (for example, the optical film 18 is rotated by an appropriate angle in a counterclockwise direction), the occurrence of moiré interference can be avoided. In some embodiments, the first angle θ1 also includes other suitable angles that can avoid moiré interference.

Figure 5:
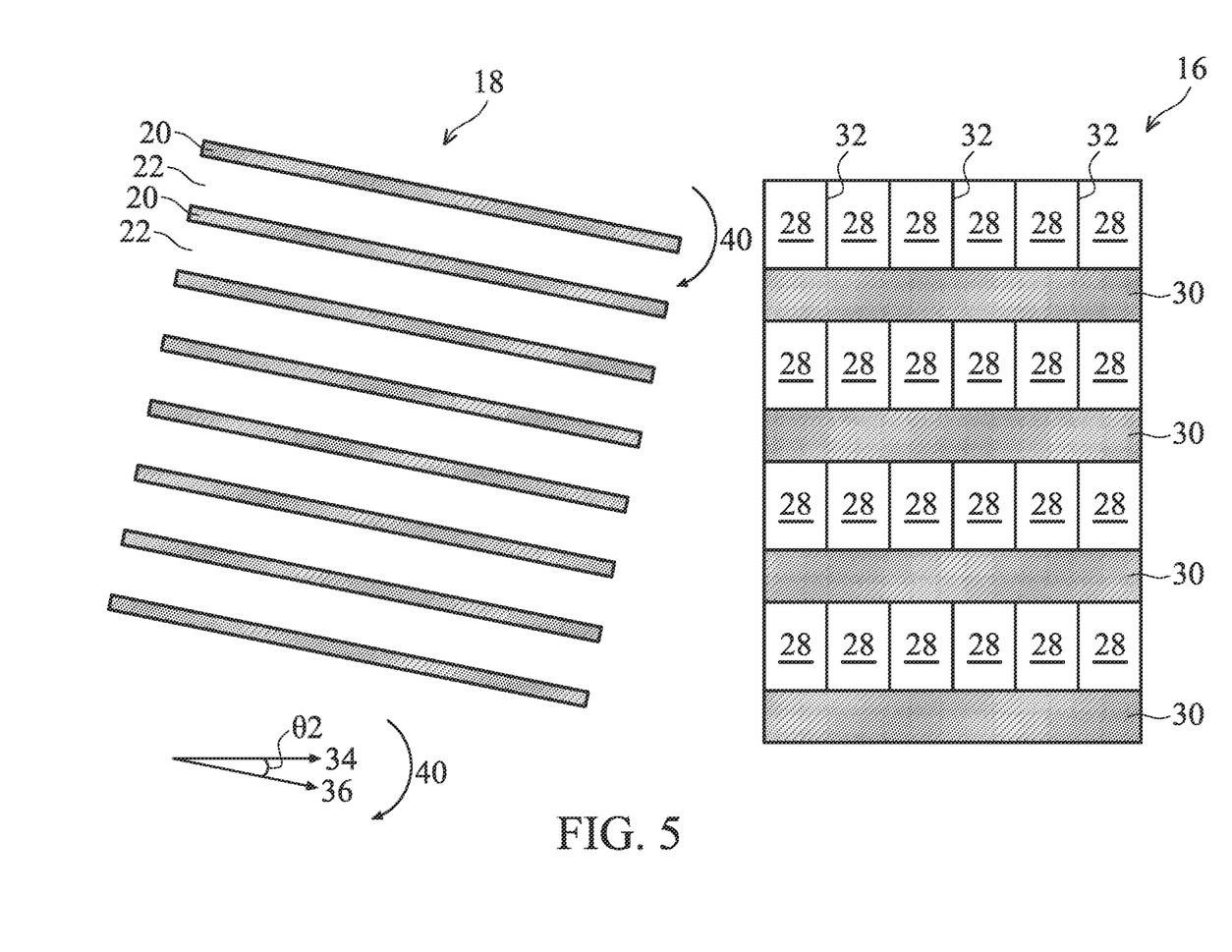
FIG. 5 illustrates a top view of a configuration relationship between a display panel and an optical film in accordance with one embodiment of the present disclosure.

Referring to FIG. 5, in accordance with one embodiment of the present disclosure, the configuration between the display panel 16 and the optical film 18 is provided. FIG. 5 illustrates a top view of the configuration between the display panel 16 and the optical film 18.

In FIG. 5, the optical film 18 is disposed under the display panel 16. For the convenience of description, some components of the display panel 16 are disclosed, for example, a plurality of color filters 28, a plurality of scan lines 30 and a plurality of data lines 32. The color filters 28 are disposed on a substrate (not shown). The scan lines 30 and the data lines 32 are periodically disposed on the substrate and located around the color filters 28. The viewer watches this display panel, and defines the horizontal viewing angles as 0 degrees and 180 degrees, and the vertical viewing angles as 90 degrees and 270 degrees. The scan lines 30 extend in a first direction 34. The angle between the first direction 34 and the zero-degree viewing angle ranges from 90 degrees to −90 degrees. The optical film 18 includes the plurality of light-blocking portions 20 and the plurality of light-transmission portions 22, which are alternately arranged with each other. The light-blocking portions 20 extend in a second direction 36. The angle between the second direction 36 and the zero-degree viewing angle ranges from 90 degrees to −90 degrees. Specifically, the first direction 34 and the second direction 36 are not parallel to avoid moiré interference. However, when the angle between the first direction and the second direction is too large, light with a large viewing angle will be emitted. If the display panel is an automotive panel, the light with the large viewing angle will shine on the windshield and then be reflected to the human eyes, affecting the driver. As shown in FIG. 5, a second angle θ2 is formed between the second direction 36 in which the light-blocking portions 20 of the optical film 18 extend and the first direction 34 in which the scan lines 30 extend, in a clockwise direction 40 relative to the first direction 34 (that is, the angle that the optical film 18 is rotated by the second angle θ2 in a clockwise direction 40). In some embodiments, the second angle θ2 is greater than 0 degrees and less than or equal to 20 degrees, which can avoid the occurrence of moiré interference and reduce the light from the automotive display panel shining on the windshield and then reflecting to the eyes, affecting the driver. In some embodiments, the second angle θ2 is greater than or equal to 4 degrees and less than or equal to 15 degrees. Similarly, since the display panel 16 and the underneath optical film 18 both contain periodic patterns, moiré interference is likely to occur when the two are superimposed. At this time, if the optical film 18 is appropriately rotated as shown in FIG. 5 (for example, the optical film 18 is rotated by an appropriate angle in a clockwise direction), the occurrence of moiré interference can be avoided and the light from the automotive display panel can be reduced from irradiating the windshield and reflecting to the human eyes, affecting the driver. In some embodiments, the second angle θ2 also includes other suitable angles that can avoid moiré interference.

Figure 6:
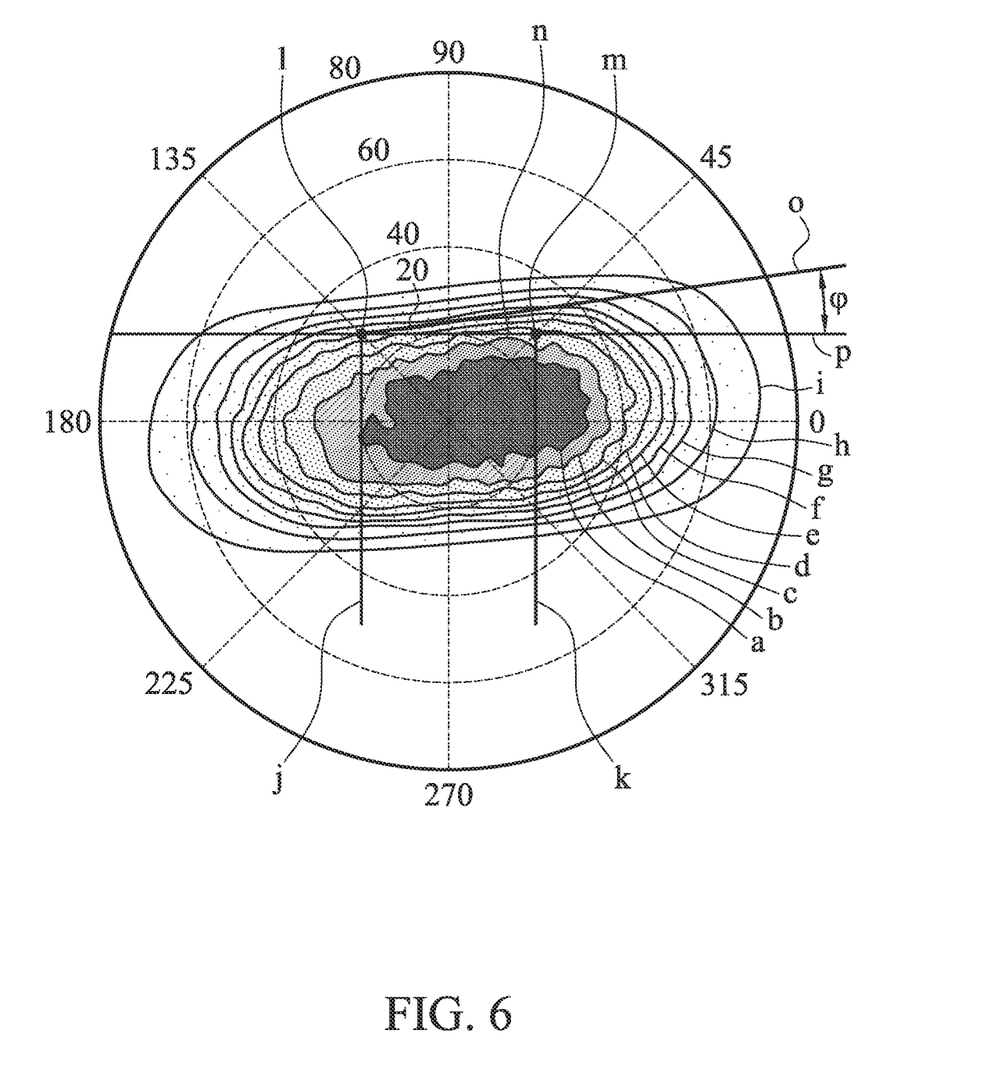
FIG. 6 illustrates a distribution diagram of intensity of light emitted by a display device varying with viewing angle in accordance with one embodiment of the present disclosure.
Figure 7:
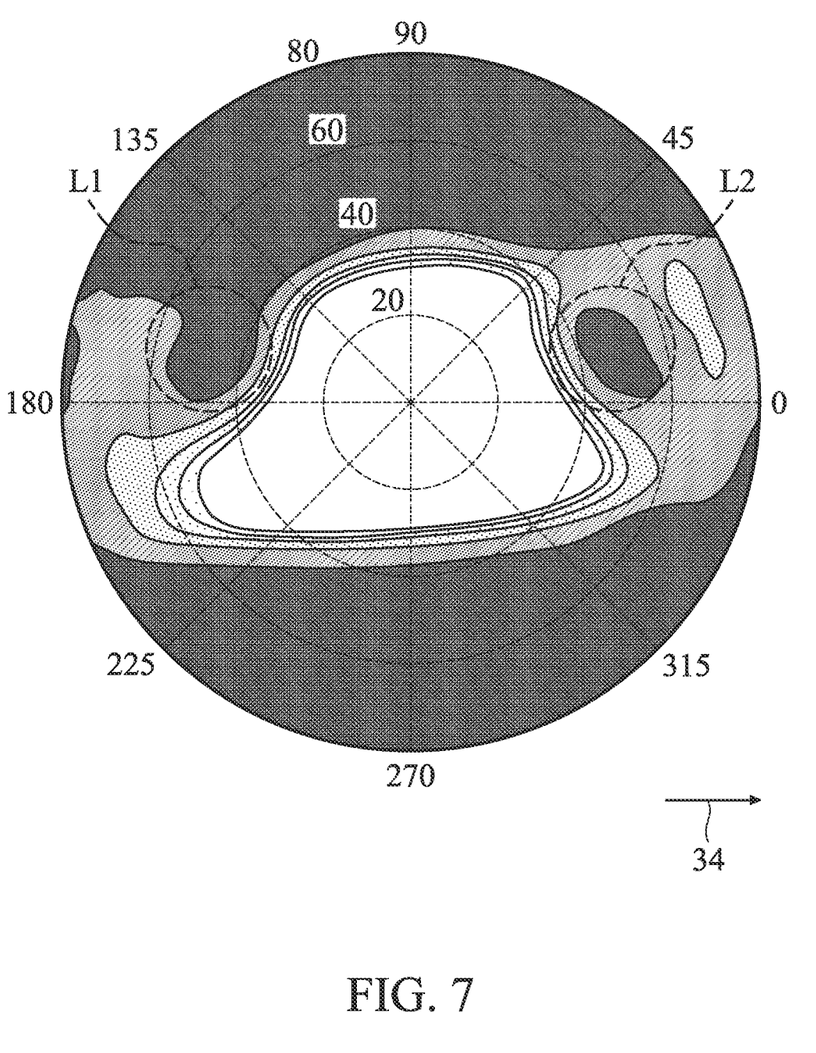
FIG. 7 illustrates a distribution diagram of intensity of light emitted by a display device varying with viewing angle in accordance with one embodiment of the present disclosure.
Figure 8:
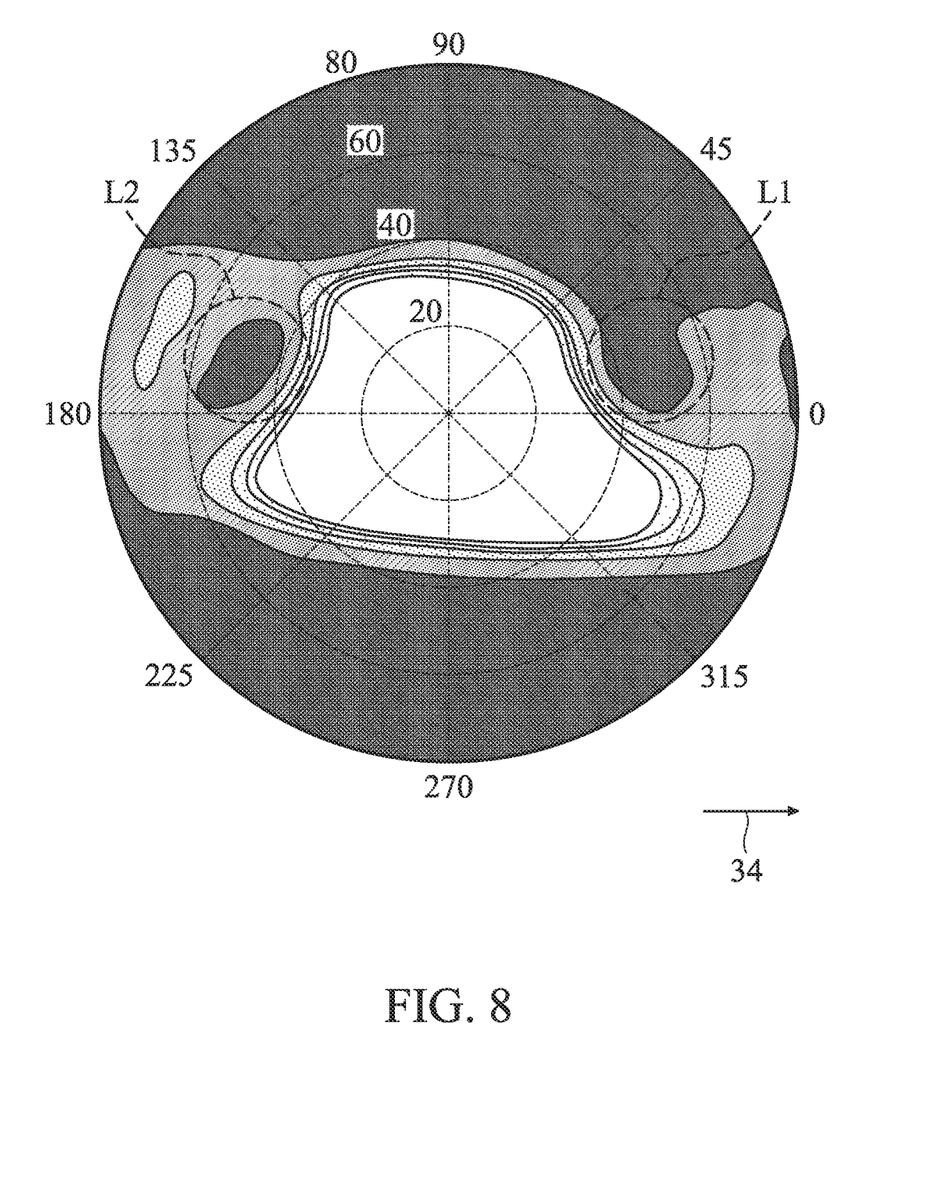
FIG. 8 illustrates a distribution diagram of intensity of light emitted by a display device varying with viewing angle in accordance with one embodiment of the present disclosure.

Referring to FIGS. 6-8, according to the aforementioned placement relationship between the optical film and the display panel, the distribution of the intensity (brightness) of the light emitted by the display device with the viewing angle at a tilt angle of 35 degrees to 55 degrees is illustrated.

FIG. 6 shows light-pattern curves (a, b, c, d, e, f, g, h and i) obtained according to various azimuth angles (viewing angles) (for example, 0 degrees, 45 degrees, 90 degrees, 135 degrees, 180 degrees, 225 degrees, 270 degrees and 315 degrees) and various tilt angles (for example, 0 degrees (front viewing angle), 20 degrees, 40 degrees, 60 degrees and 80 degrees). In the figure, the area enclosed by the light-pattern curve "a" is the area with higher light intensity, and the light intensity decreases from the inside to the outside, and the area enclosed by the light-pattern curve "i" is the area with lower light intensity. Since the optical film blocks the light from the upper and lower viewing angles, the overall light-pattern curves are elliptical. From the light-pattern curves in the figure, an optimal light-pattern angle can be further defined by linear regression. The light intensity with the tilt angle of 0 degrees (front viewing angle) is standardized and defined as 100%. The light-pattern curve with a light intensity of 50%, for example, the light-pattern curve "d" is chosen. The two line segments (j and k) are drawn as tangents to the circle formed by the tilt angle of 20 degrees, that is, the tilt angle is set in a range of plus or minus 20 degrees. The intersections (1 and m) of the line segments (j and k) and the light-pattern curve "d" are connected to form a line segment "n". Linear regression is performed on the data of each point on the line segment "n" to obtain a straight line "o". The angle φ between the straight line "o" obtained by linear regression and the horizontal line "p" defines the optimal light-pattern angle (for example, between −4 degrees and −15 degrees and between +4 degrees and +15 degrees).

The optimal light-pattern angle obtained by the above method can correspond to the optimal rotation angle of the optical film. For example, when the optimal light-pattern angle is between −4 degrees and −15 degrees, the optical film can be rotated correspondingly in a counterclockwise direction relative to the first direction between −4 degrees and −15 degrees. When the optimal light-pattern angle is between greater than 0 degrees and −20 degrees, the optical film can be rotated correspondingly in a counterclockwise direction relative to the first direction between greater than 0 degrees and −20 degrees (the above-mentioned rotation state of the optical film in a counterclockwise direction is similar to the configuration of the display panel 16 and the optical film 18 as shown in FIG. 4). When the optimal light-pattern angle is between +4 degrees and +15 degrees, the optical film can be rotated correspondingly in a clockwise direction relative to the first direction between +4 degrees and +15 degrees. When the optimal light-pattern angle is between greater than 0 degrees and +20 degrees, the optical film can be rotated correspondingly in a clockwise direction relative to the first direction between greater than 0 degrees and +20 degrees (the above-mentioned rotation state of the optical film in a clockwise direction is similar to the configuration of the display panel 16 and the optical film 18 as shown in FIG. 5). For the driver in a left-hand drive car, if the optical film rotates the above angle (i.e. −4 degrees to −15 degrees or greater than 0 degrees to −20 degrees) in a counterclockwise direction, a more suitable effect of light-pattern distribution will be obtained. For the driver in a right-hand drive car, if the optical film rotates the above angle (i.e. +4 degrees to +15 degrees or greater than 0 degrees to +20 degrees) in a clockwise direction, a more suitable effect of light-pattern distribution will be obtained.

Here, the more suitable effect of light-pattern distribution means that the display device can block the light to be projected to a specific area of the windshield without disturbing the driver. For example, referring to FIG. 7, for the driver in a left-hand drive car, the light intensity emitted by the display device at the first position L1 is lower than the light intensity emitted by the display device at the second position L2. In FIG. 7, the first position L1 refers to the position where the first direction 34 rotates between 155 degrees and 175 degrees in a counterclockwise direction. The second position L2 refers to the position where the first direction 34 rotates between 5 degrees and 25 degrees in a counterclockwise direction. Therefore, when the driver in a left-hand drive car is driving the vehicle, there will be no light that interferes with the driver's sight on the specific area of the windshield within his sight. Referring to FIG. 8, for the driver in a right-hand drive car, the light intensity emitted by the display device at the first position L1 is lower than the light intensity emitted by the display device at the second position L2. In FIG. 8, the first position L1 refers to the position where the first direction 34 rotates between 5 degrees and 25 degrees in a counterclockwise direction. The second position L2 refers to the position where the first direction 34 rotates between 155 degrees and 175 degrees in a counterclockwise direction. Therefore, when the driver in a right-hand drive car is driving the vehicle, there will be no light that interferes with the driver's sight on the specific area of the windshield within his sight.

Figure 9:
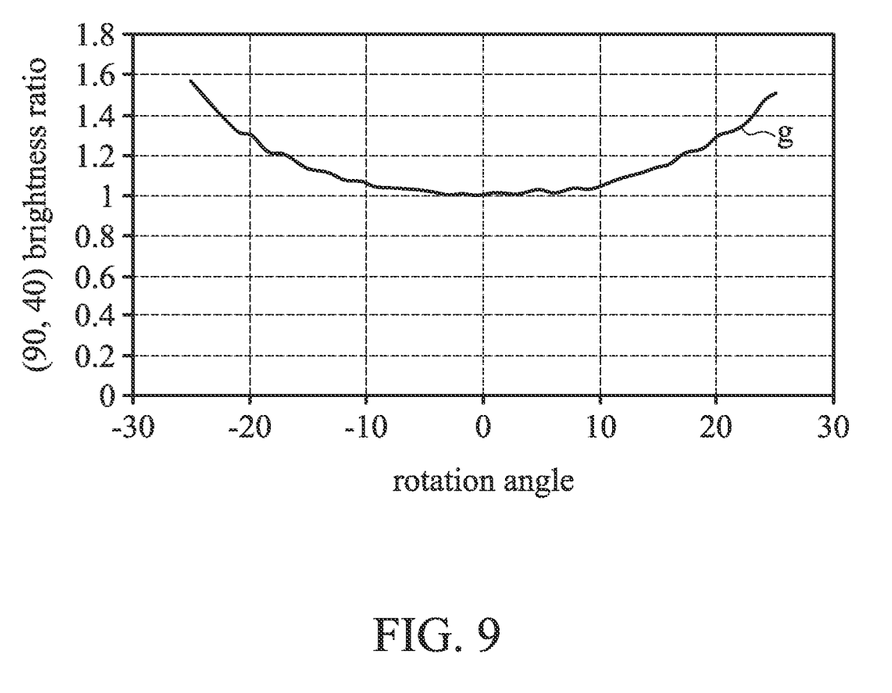
FIG. 9 illustrates a relationship curve between a rotation angle of an optical film and intensity of light emitted by a display device in accordance with one embodiment of the present disclosure.

Referring to FIG. 9, in accordance with one embodiment of the present disclosure, a relationship between a rotation angle of an optical film and intensity (brightness) of light emitted by a display device is illustrated. FIG. 9 illustrates a relationship curve between a rotation angle of an optical film and brightness of light emitted by a display device.

FIG. 9 shows a relationship curve "q" between a rotation angle of an optical film and brightness of light emitted by a display device at a specific position (a viewing angle of 90 degrees and a tilt angle of 40 degrees). It can be seen from the curve "q" that the greater the rotation angle of the optical film, the greater the brightness of the light, which means that the greater the rotation angle of the optical film, the greater the brightness of the light projected to the above-mentioned specific position, which will cause adverse interference to the driver's sight. In order to make the brightness increase less than 10% (i.e. brightness ratio of less than 1.1), the rotation angle of the optical film needs to be less than ±15 degrees. In order to make the brightness increase less than 30% (i.e. brightness ratio of less than 1.3), the rotation angle of the optical film needs to be less than ±20 degrees. Considering that the rotation angle of the optical film is greater than ±4 degrees to improve the moiré interference phenomenon, the optimal rotation angle of the optical film falls between −4 degrees to −15 degrees and +4 degrees to +15 degrees. Therefore, in the display device, if the optical film is rotated counterclockwise or clockwise at the optimal angle, not only can the moiré interference phenomenon be avoided, but also the privacy effect of the left-hand drive car and the right-hand drive car can be improved at the same time.

Although some embodiments of the present disclosure and their advantages have been described in detail, it should be understood that various changes, substitutions and alterations can be made herein without departing from the spirit and scope of the disclosure as defined by the appended claims. The features of the various embodiments can be used in any combination as long as they do not depart from the spirit and scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods or steps. In addition, each claim constitutes an individual embodiment, and the claimed scope of the present disclosure includes the combinations of the claims and embodiments. The scope of protection of present disclosure is subject to the definition of the scope of the appended claims. Any embodiment or claim of the present disclosure does not need to meet all the purposes, advantages, and features disclosed in the present disclosure.

What is claimed is:

1. A display device, comprising:
   a display panel, comprising:
   a substrate;
   a color filter layer on the substrate;
   a lower polarizer under the color filter layer; and
   a plurality of scan lines disposed on the substrate and extending in a first direction;
   a backlight module disposed under the display panel; and
   an optical film disposed between the display panel and the backlight module and comprising a plurality of light-blocking portions and a plurality of light-transmission portions which are arranged alternately, wherein the light blocking portions extend in a second direction, and the first direction and the second direction are not parallel, wherein a first angle is formed between the second direction and the first direction in a counterclockwise direction relative to the first direction, and the first angle is greater than 0 degrees and less than or equal to 20 degrees,
   wherein the display device emits a light intensity at a first position which is different from that at a second position, the first position refers to a position where the first direction rotates between 155 degrees and 175 degrees in a counterclockwise direction, and the second position refers to a position where the first direction rotates between 5 degrees and 25 degrees in a counterclockwise direction.

2. The display device according to claim 1, wherein the display device emits a light intensity at a first position which is lower than that at a second position, the first position is a position where the first direction rotates between 155 degrees and 175 degrees in a counterclockwise direction, and the second position is a position where the first direction rotates between 5 degrees and 25 degrees in a counterclockwise direction.

3. The display device according to claim 1, wherein the first angle is greater than or equal to 4 degrees and less than or equal to 15 degrees.

4. The display device according to claim 1, wherein a second angle is formed between the second direction and the first direction in a clockwise direction relative to the first direction, and the second angle is greater than 0 degrees and less than or equal to 20 degrees.

5. The display device according to claim 1, wherein the display device emits a light intensity at a first position which is lower than that at a second position, the first position is a position where the first direction rotates between 5 degrees and 25 degrees in a counterclockwise direction, and the second position is a position where the first direction rotates between 155 degrees and 175 degrees in a counterclockwise direction.

6. The display device according to claim 4, wherein the second angle is greater than or equal to 4 degrees and less than or equal to 15 degrees.

7. The display device according to claim 1, further comprising a privacy structure disposed on the backlight module.

8. The display device according to claim 7, wherein the optical film is disposed between the backlight module and the privacy structure.

9. The display device according to claim 7, wherein the optical film is disposed between the privacy structure and the display panel.

10. A display device, comprising:
    a display panel, comprising:
    a substrate;
    an upper polarizer on the substrate; and
    a plurality of scan lines disposed on the substrate and extending in a first direction; and
    an optical film disposed above the display panel and comprising a plurality of light-blocking portions and a plurality of light-transmission portions which are arranged alternately, wherein the light blocking portions extend in a second direction, and the first direction and the second direction are not parallel, wherein a first angle is formed between the second direction and the first direction in a counterclockwise direction relative to the first direction, and the first angle is greater than 0 degrees and less than or equal to 20 degrees,
    wherein the display device emits a light intensity at a first position which is different from that at a second position, the first position refers to a position where the first direction rotates between 155 degrees and 175 degrees in a counterclockwise direction, and the second position refers to a position where the first direction rotates between 5 degrees and 25 degrees in a counterclockwise direction.

11. The display device according to claim 10, wherein the display device emits a light intensity at a first position which is lower than that at a second position, the first position is a position where the first direction rotates between 155 degrees and 175 degrees in a counterclockwise direction, and the second position is a position where the first direction rotates between 5 degrees and 25 degrees in a counterclockwise direction.

12. The display device according to claim 10, wherein the first angle is greater than or equal to 4 degrees and less than or equal to 15 degrees.

13. The display device according to claim 10, wherein a second angle is formed between the second direction and the first direction in a clockwise direction relative to the first direction, and the second angle is greater than 0 degrees and less than or equal to 20 degrees.

14. The display device according to claim 10, wherein the display device emits a light intensity at a first position which is lower than that at a second position, the first position is a position where the first direction rotates between 5 degrees and 25 degrees in a counterclockwise direction, and the second position is a position where the first direction rotates between 155 degrees and 175 degrees in a counterclockwise direction.

15. The display device according to claim 13, wherein the second angle is greater than or equal to 4 degrees and less than or equal to 15 degrees.

16. The display device according to claim 10, further comprising a privacy structure disposed on the display panel.

17. The display device according to claim 16, wherein the optical film is disposed between the display panel and the privacy structure.

18. The display device according to claim 16, wherein the optical film is disposed on the privacy structure.

* * * * *